(12) United States Patent
McGinnis et al.

(10) Patent No.: US 10,676,814 B2
(45) Date of Patent: Jun. 9, 2020

(54) SYSTEM AND METHOD FOR CONTROLLING THE ELEMENTAL COMPOSITION OF FILMS PRODUCED BY PULSED LASER DEPOSITION

(71) Applicant: The United States of America as represented by the Secretary of the Navy, San Diego, CA (US)

(72) Inventors: Wayne C. McGinnis, San Diego, CA (US); Alexandru Hening, San Diego, CA (US); Teresa Emery-Adleman, San Diego, CA (US)

(*) Notice: Subject to any disclaimer, the term of this patent is extended or adjusted under 35 U.S.C. 154(b) by 66 days.

(21) Appl. No.: 15/718,202

(22) Filed: Sep. 28, 2017

(65) Prior Publication Data

US 2019/0093212 A1 Mar. 28, 2019

(51) Int. Cl.
*C23C 14/50* (2006.01)
*C23C 14/08* (2006.01)
*C23C 14/28* (2006.01)

(52) U.S. Cl.
CPC ............ *C23C 14/505* (2013.01); *C23C 14/08* (2013.01); *C23C 14/28* (2013.01)

(58) Field of Classification Search
CPC ........ C23C 14/505; C23C 14/08; C23C 14/28
See application file for complete search history.

(56) References Cited

U.S. PATENT DOCUMENTS

| | | | | |
|---|---|---|---|---|
| 5,015,492 A | * | 5/1991 | Venkatesan | ............. C23C 14/28 118/50.1 |
| 5,037,521 A | * | 8/1991 | Nishikawa | ............... C23C 14/28 204/298.02 |
| 5,145,713 A | | 9/1992 | Venkatesan | |

(Continued)

OTHER PUBLICATIONS

Appl. Phys. A 78, 1049-1052 (2004) (Year: 2004).*

(Continued)

*Primary Examiner* — Charlee J. C. Bennett
(74) *Attorney, Agent, or Firm* — Naval Information Warfare Center Pacific; Kyle Eppele; James McGee

(57) ABSTRACT

A pulsed laser deposition system comprising a split ablation target having a first half and a second half, wherein the target contains a film material for deposition on a substrate, and wherein the film material is comprised of a plurality of component elements, the elements varying in volatility, and wherein one half of the split ablation target contains more of the most volatile elements being deposited than the other half, and wherein the split ablation target is rotated about its center. A laser beam is rastered back and forth across the target such that the laser spends more time on one half of the split target than the other half depending on the elemental volatility. The target rotation and laser beam rastering are coordinated simultaneously to vary the elemental composition of the resulting film deposition.

20 Claims, 9 Drawing Sheets

(56) References Cited

U.S. PATENT DOCUMENTS

| | | | | |
|---|---|---|---|---|
| 5,242,706 A * | 9/1993 | Cotell | A61F 2/30767 | 204/298.02 |
| 6,090,207 A * | 7/2000 | Knauss | C23C 14/28 | 118/715 |
| 6,372,306 B1 | 4/2002 | Smith | | |
| 6,491,759 B1 | 12/2002 | Christen | | |
| 2002/0081397 A1* | 6/2002 | McGill | B05D 1/60 | 427/596 |
| 2004/0110042 A1* | 6/2004 | Holesinger | C23C 14/087 | 428/701 |
| 2007/0014129 A1* | 1/2007 | Inukai | H02M 3/33515 | 363/21.01 |
| 2007/0114129 A1* | 5/2007 | Hayashi | C23C 14/085 | 204/298.12 |
| 2007/0129255 A1* | 6/2007 | Varanasi | C23C 14/087 | 505/100 |
| 2010/0227133 A1* | 9/2010 | Liu | C23C 14/3435 | 428/209 |
| 2012/0244032 A1* | 9/2012 | Lappalainen | C23C 14/16 | 420/433 |
| 2017/0282214 A1* | 10/2017 | Stiff-Roberts | C23C 14/12 | |

OTHER PUBLICATIONS

Appl. Phys. Lett. 87, 072508 (2005) to Bea et al (Year: 2005).*
C.-C. Lee, J.-M. Wu / Applied Surface Science 253 (2007) 7069-7073 (Year: 2007).*
A.V. Meera et al. / Journal of Alloys and Compounds 790 (2019) 1108-1118 (Year: 2019).*
J Electroceram (2014) 33:25-30 (Year: 2014).*
Ceramics International 42 (2016) 6555-6571 to Athayde et al (Year: 2016).*
T. Aoki, et al., "Rewriteable optical recording In—Zn oxide films grown by pulsed laser deposition method," Proc. of SPIE, vol. 5060, p. 154 (2003).
H. M. Christen and G. Eres, "Recent advances in pulsed-laser deposition of complex oxides," J. Phys.: Condensed Matter, vol. 20, p. 264005 (2008).
J.R. Duclère, et al., "Composition control of SBN thin films deposited by PLD on various substrates," Intl. J. Org. Materials vol. 3, p. 1133 (2001).

* cited by examiner

SYSTEM AND METHOD FOR CONTROLLING THE ELEMENTAL COMPOSITION OF FILMS PRODUCED BY PULSED LASER DEPOSITION

FEDERALLY-SPONSORED RESEARCH AND DEVELOPMENT

The Method for Controlling the Elemental Composition of Films Produced by Pulsed Laser Deposition is assigned to the United States Government and is available for licensing for commercial purposes. Licensing and technical inquiries may be directed to the Office of Research and Technical Applications, Space and Naval Warfare Systems Center, Pacific, Code 72120, San Diego, Calif., 92152; voice (619) 553-5118; email ssc_pac_T2@navy.mil. Reference Navy Case Number 104742.

BACKGROUND

Pulsed Laser Deposition (PLD) is a method for growth of chemically complex materials, oftentimes allowing for stoichiometric transfer of the target material to the substrate that supports the deposited film. In some cases, though, target stoichiometry is preserved only under very specific deposition conditions that vary depending on the target material and the substrate temperature. Such conditions are often difficult and time-consuming to determine.

Prior methods used to address this problem include: (1) use of multiple ablation targets (on a trial-and-error basis) to determine the exact target composition needed to produce the desired film composition, (2) use of a split target (or two separate single-composition targets), with different laser dwell times on each target half (by alternatively ablating each target half, spending a different amount of time on each half), but without target rotation combined with laser beam rastering (continuous back and forth motion), and (3) use of a split or sectioned target that is rotated around a point not coincident with the target center (varying the distance between the rotation point and the target center to achieve various film compositions), but with no laser beam rastering.

Prior method 1 is time consuming and expensive, requiring the manufacture or purchase of numerous targets of various compositions. Prior method 2 can result in alternating layers of the target material halves, requiring post-deposition annealing to achieve a homogeneous film, and non-uniform target surface usage. Prior method 3 requires a special mechanism for the off-target-center rotation (or a smaller target than would be used for on-target-center rotation) and does not incorporate laser beam rastering to maximize target surface usage and ablation uniformity.

The method disclosed herein uses PLD with a single two-part (split) ablation target to grow thin layers of multi-component films with control over the resultant film elemental composition, while still rotating the target about its center to maximize target usage (or coverage) and to more uniformly ablate the target surface.

DETAILED DESCRIPTION OF SOME EMBODIMENTS

Figure 1:
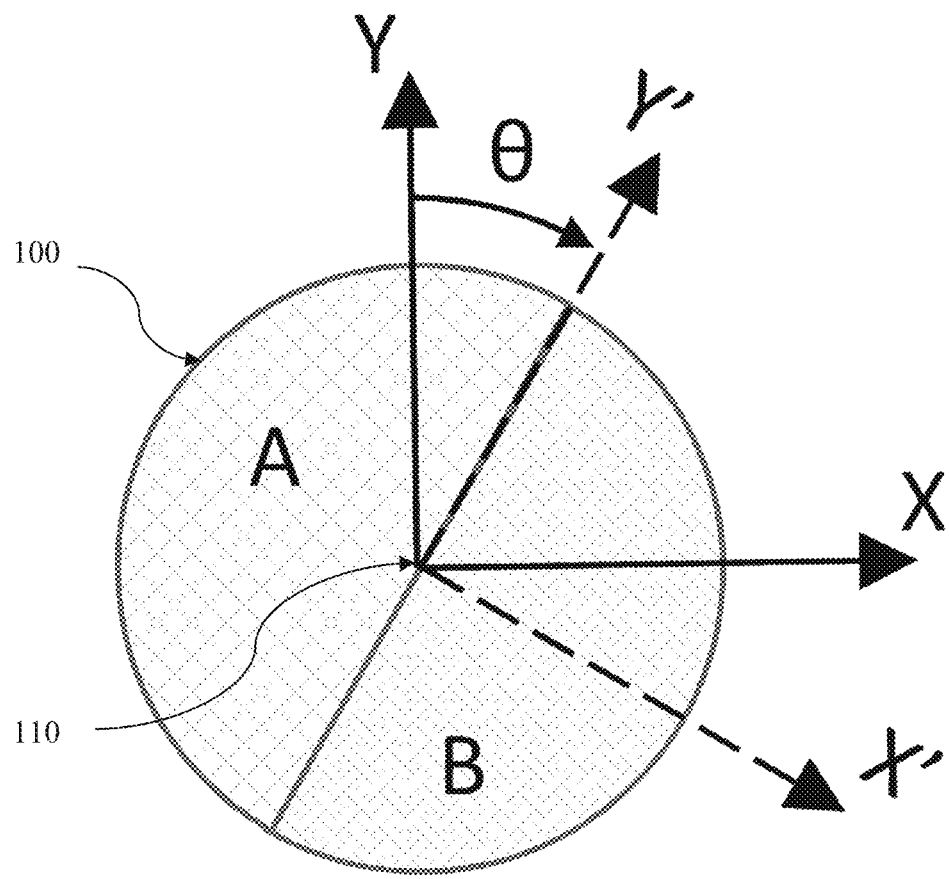
FIG. 1 shows an embodiment of a target rotation with beam rastering.

Reference in the specification to "one embodiment" or to "an embodiment" means that a particular element, feature, structure, or characteristic described in connection with the embodiments is included in at least one embodiment. The appearances of the phrases "in one embodiment", "in some embodiments", and "in other embodiments" in various places in the specification are not necessarily all referring to the same embodiment or the same set of embodiments.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

Additionally, use of the "a" or "an" are employed to describe elements and components of the embodiments herein. This is done merely for convenience and to give a general sense of the invention. This detailed description should be read to include one or at least one and the singular also includes the plural unless it is obviously meant otherwise.

Disclosed herein is a method to control the elemental composition of films deposited onto substrates using Pulsed Laser Deposition (PLD). In standard PLD, a small (typically 1 to 2 inch diameter and 0.2 inches thick) cylindrical ablation target is ablated with focused, energetic laser pulses, with the resulting ablated material deposited onto a nearby substrate positioned parallel to the target surface and aligned with the target center. To maximize target usage and ablation uniformity, the target is often rotated (at a few rpm) and the laser beam moved (or rastered) back and forth across the target surface, along the target diameter (or the laser beam is stationary, and the target is moved back and forth instead). The target material usually has a single, uniform elemental composition.

Under favorable circumstances, the target composition will be reproduced in the deposited film. In some cases, though, the deposited film can have a composition different from that of the target. In other words, the stoichiometry has not been preserved. For example, if the film is deposited onto a substrate heated to several hundred degrees Celsius from a target with component elements that vary widely in volatility at that temperature, then the more volatile elements may evaporate from the substrate during the film growth process, while the less volatile elements do not. This will result in films with a smaller ratio of volatile elements to non-volatile elements when compared to the target. For example, a film deposited from a bismuth iron oxide ($BiFeO_3$) target may have a composition of $Bi_{0.7}FeO_3$ (bismuth deficient).

The method disclosed herein uses a split (or multi-section) ablation target that is rotated about its center (to maximize target usage or coverage, and to more uniformly ablate the target surface) combined with a laser beam that is rastered across the target such that, over the course of the raster cycle (and the deposition), it spends more time on one half of the split target than on the other half. One half of the split target contains more of the most volatile element being deposited than the other half. Using growth of a BiFeO3 film as an example, one target half might have a 2:1 atomic ratio of bismuth (Bi) to iron (Fe), while the other half has a 1:1 atomic ratio of these elements. By spending more or less time on the bismuth-rich target side, the laser beam will ablate more or less bismuth, resulting in a film with a higher or lower Bi:Fe ratio, respectively.

FIG. 1 shows a target rotation with beam rastering, wherein the geometry of a laser beam is rastered back and forth across the diameter of a rotating laser ablation target 100. Target 100 is rotated about its center 110, at a constant, specified rotational speed. At any given time t, the extent of the target rotation is given by the target rotation angle, $\theta$ (theta), where $\theta=0$ at t=0. A laser beam (not shown here) is rastered along the Y axis in positive and negative directions; the beam position, Y, is usually set to 0 at t=0. The position of the beam can be enumerated as coordinates in the X-Y plane (in the laboratory frame of reference) or as coordinates in the X'-Y' plane (in the ablation target frame of reference, i.e., as if one were observing the beam while standing on the target as it rotates).

Figure 2:
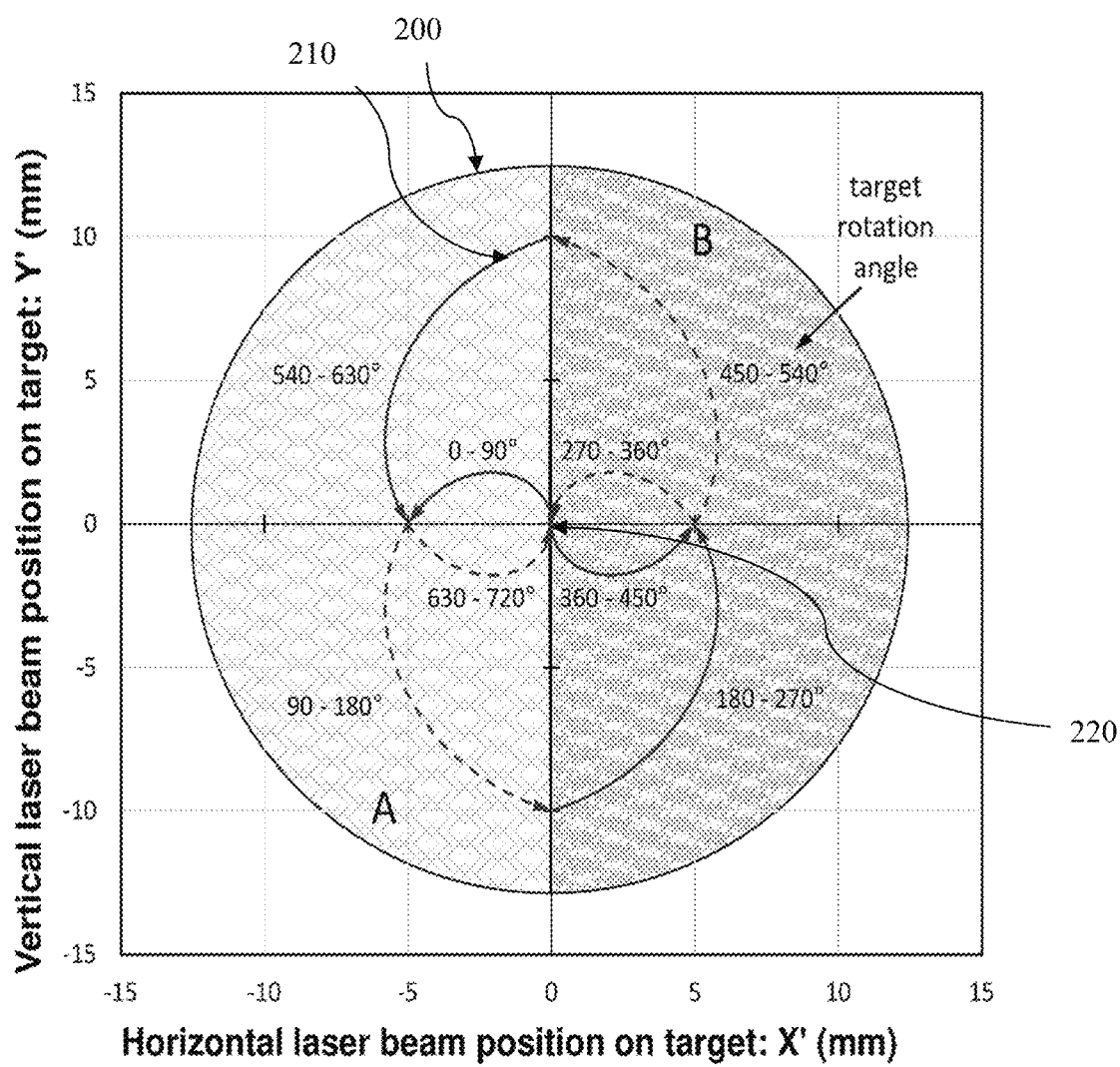
FIG. 2 shows an embodiment of a target with a beam raster pattern of 10 mm, 10 rpm, and 360 degrees having a fast rotation.

FIG. 2 shows a target 200 comprising a first half A and a second half B, demonstrating fast rotation with a beam raster pattern 210 of (10 mm, 10 rpm, 360 deg). "Fast rotation" refers to the case where target 200 undergoes many revolutions during the course of the PLD of a single film or sample. FIG. 2 shows the pattern 210 that a rastered beam will trace out on the target 200 surface during the first two revolutions of target 200. For the simulated data shown in FIG. 2, target 200 rotates at 10 rpm, and the beam rasters +/−10 mm from target center 220. There are four steps of beam motion for one complete raster cycle: (1) beam moves +10 mm from target center 220 to near the target edge, (2) beam moves back to target center 220, (3) beam moves −10 mm near to opposite edge of target 200, and (4) beam moves back to target center 220. One raster cycle must be completed in an integral number of complete target revolutions (for the data of this figure, one raster cycle is completed every two target revolutions, or every 720° of target rotation). Typically, one varies the time that the beam spends on target half A relative to the time spent on target half B (and thus varies the relative amount of target half A material that ends up in the film relative to the amount of target half B material) by setting the beam raster speed to one value for raster cycle steps 1 and 2, and a different value for steps 3 and 4. Equivalently, one can set the value of $\theta$ reached after completion of step 2 (i.e., the point at which the beam returns to target center 220 in the middle of the raster cycle). For the figure data, the beam returns to target center 220 at $\theta=360°$, and thus has equal raster speeds for each half of the raster cycle (and thus spends an equal amount of time on target halves A and B).

Figure 3:
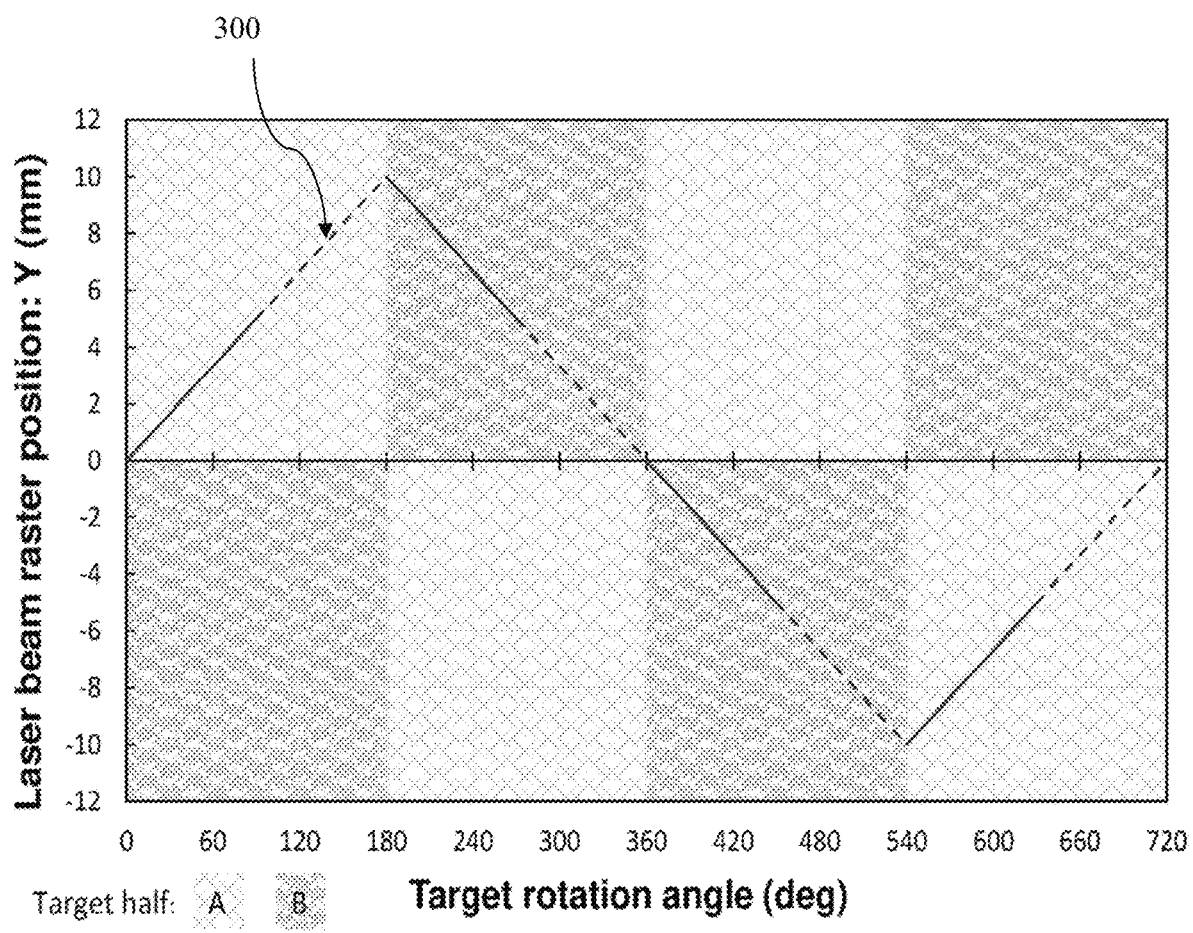
FIG. 3 shows a graph of a beam position versus a rotation angle of 10 mm, 10 rpm, 360 deg.

FIG. 3 shows a graph demonstrating Fast rotation—beam position vs rotation angle (10 mm, 10 rpm, 360 deg) in reference to Target 200 shown in FIG. 2. FIG. 3 shows the beam position 300 (along the Y axis), for the fast rotation case with equal raster speeds on each half of the raster cycle, as a function of target rotation angle $\theta$ (or, equivalently, because the target rotation speed is constant, as a function of time t). The shading indicates which half of target 200 the beam is hitting at a given value of $\theta$ or t. This figure illustrates that for the calculated case, the beam spends an equal amount of time, during one raster cycle, on target halves A and B.

Figure 4:
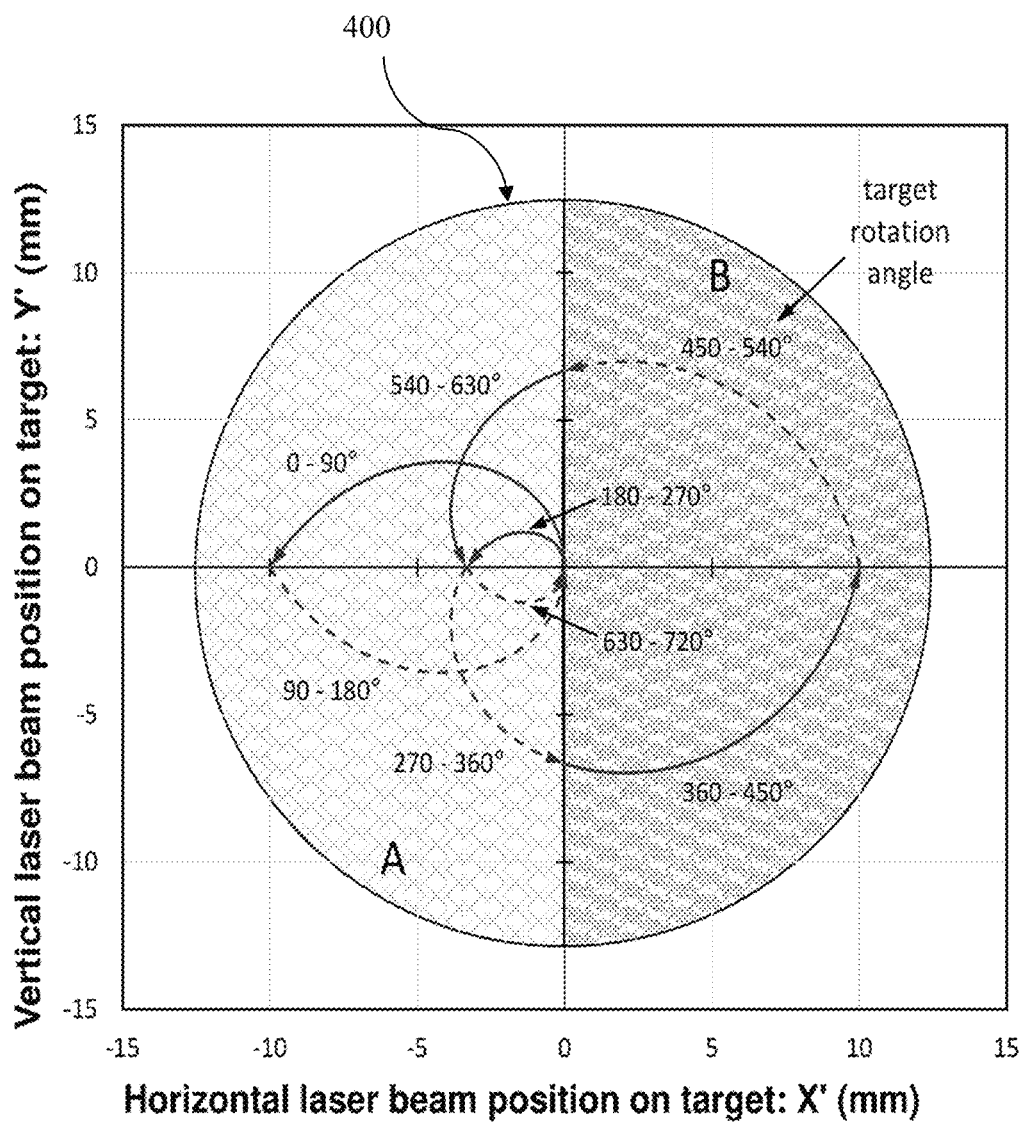
FIG. 4 shows an embodiment of a target with a beam raster pattern of 10 mm, 10 rpm, 180 deg having a fast rotation.

FIG. 4 shows a target 400 having a fast rotation—with a beam raster pattern of (10 mm, 10 rpm, 180 deg). This figure shows the same type of simulated data as for FIG. 2, but with a "return to center" angle of 180°.

Figure 5:
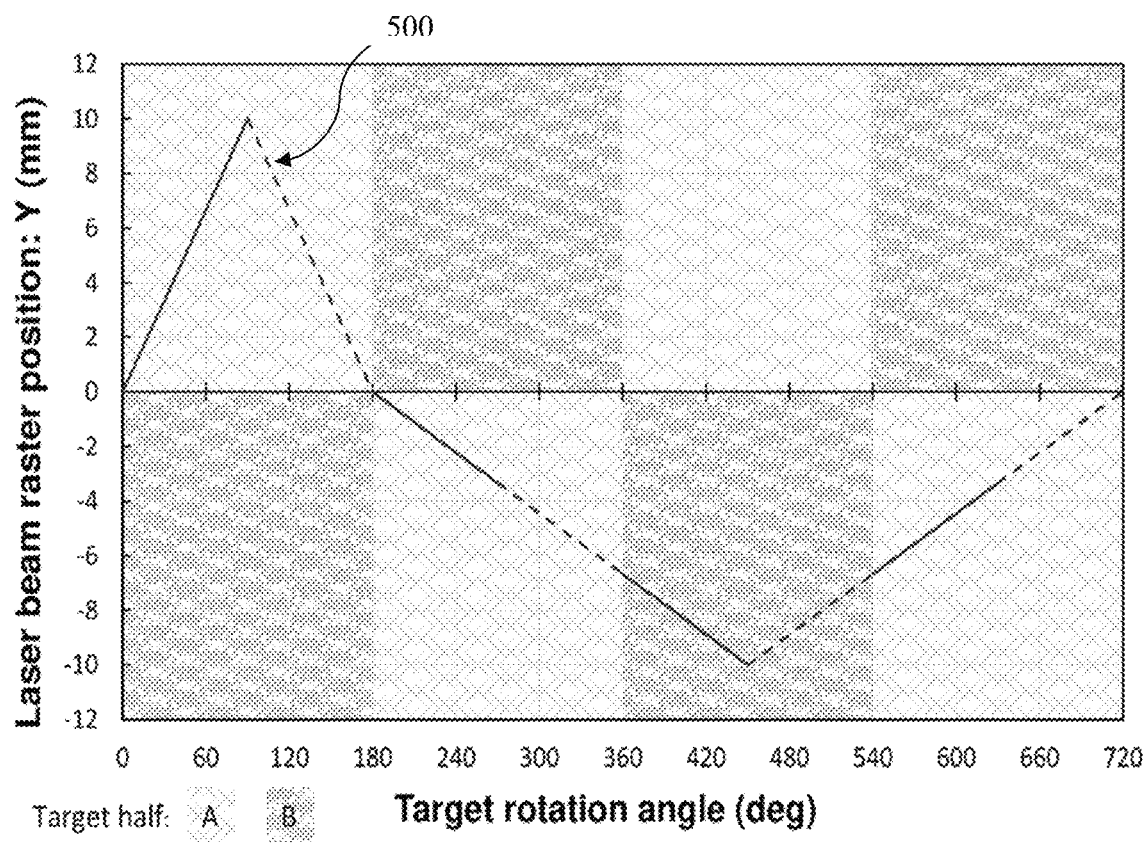
FIG. 5 shows a graph of a beam position versus a rotation angle of 10 mm, 10 rpm, 180 deg having a fast rotation.

FIG. 5 shows graph having a beam 500 demonstrating a fast rotation—beam position vs rotation angle (10 mm, 10 rpm, 180 deg). This figure shows the same type of simulated data as for FIG. 3, but with "return to center" angle of 180 degrees. For this case, the beam spends three times as much time on target half A as on target half B, resulting in a film with 3:1 ratio of target half A material to target half B material (or 75% of the film is from target half A and 25% is from target half B).

Figure 6:
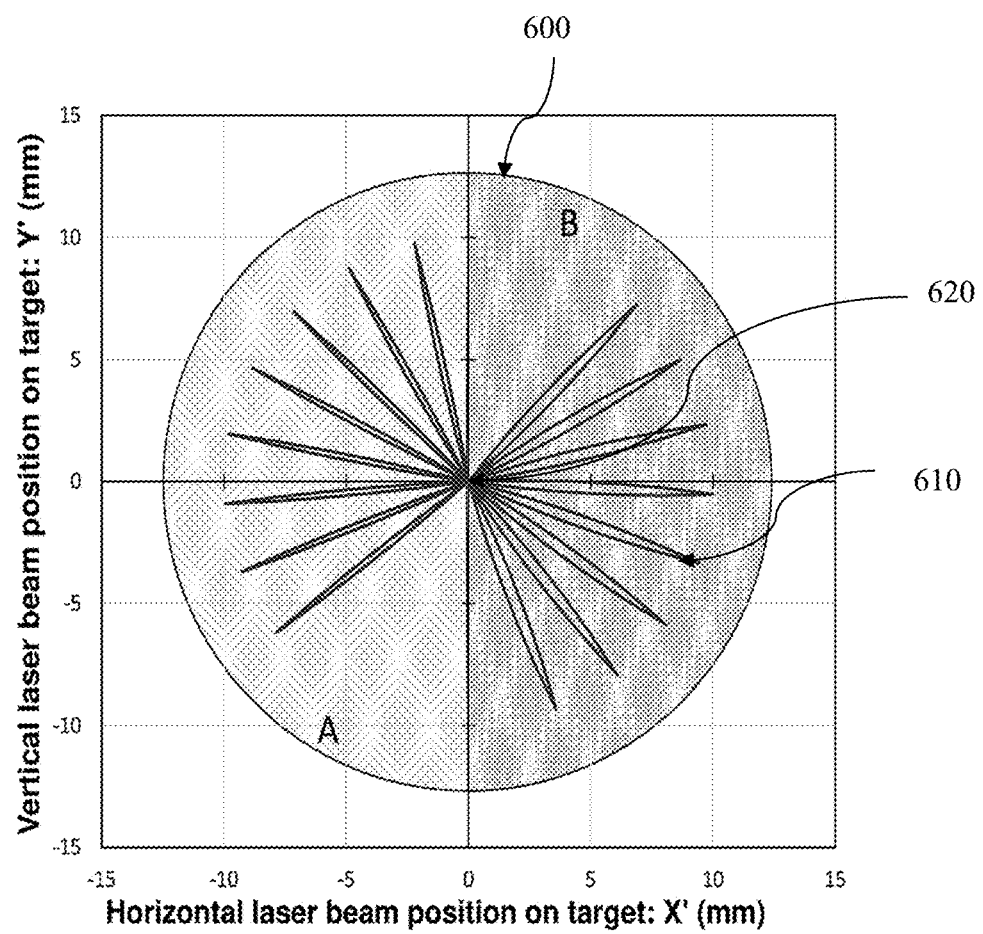
FIG. 6 shows an embodiment of a target with a beam raster pattern of 10 deg, 0.01 rpm, 2200 s, vel [2,2,1,1] having a slow rotation.

FIG. 6 shows a target 600 comprising a first half A and a second half B, demonstrating a slow rotation—beam raster pattern 610 (10 deg, 0.01 rpm, 2200 s, vel [2,2,1,1]). "Slow rotation" refers to a case where a target undergoes at most half of a revolution during the course of the PLD of a single film or sample. This figure shows pattern 610 that the rastered beam will trace out on the surface of target 600 during the first 2200 seconds of target 600 rotation (or film deposition). For the simulated data shown in the figure, target 600 rotates at 0.01 rpm, and the beam rasters +/−10 mm from the target center 620 with an initial target rotation angle of 10 degrees (at t=0). These parameters were selected to illustrate the pattern traced by the rastering beam while avoiding overlap by subsequent raster cycles (with the same four steps as described for FIG. 2); see FIG. 8 for more typical values used for actual film deposition. For this "slow rotation" case, the beam raster speeds for each half of the raster cycle were set to 2 and 1 (arbitrary, instrumental values; the actual raster speed, in mm/s, are approximately one-tenth of these values). The first "half" of the raster cycle consists of steps 1 and 2, and the second "half" consists of steps 3 and 4.

Figure 7:
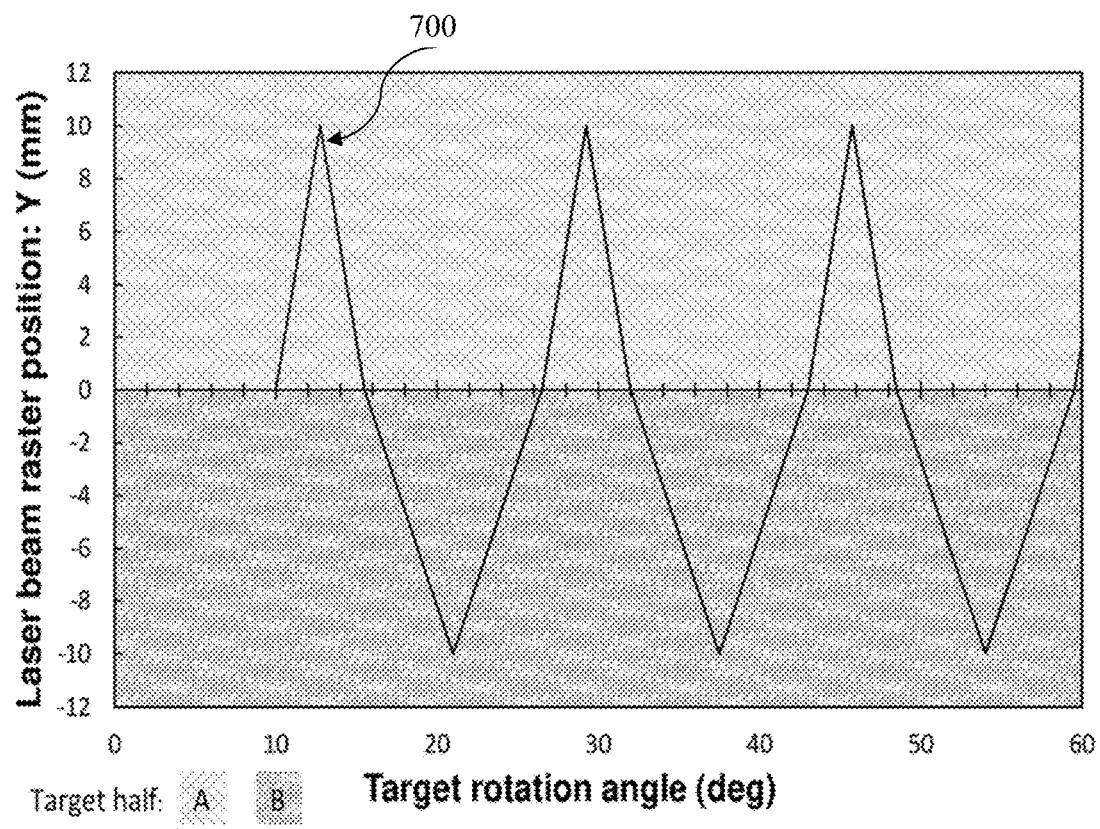
FIG. 7 shows a graph of a beam position vs rotation angle of 10 degrees, 0.01 rpm, 2200 s, vel[2,2,1,1] having a slow rotation.

FIG. 7 shows a graph with a beam 700 depicting a slow rotation—beam position vs rotation angle (10 deg, 0.01 rpm, 2200 s, vel [2,2,1,1]). FIG. 7 has a beam 700 showing the same type of simulated data as for FIGS. 3 and 5, but for the "slow rotation" case (using the parameters of FIG. 6), note the difference in the shading between this figure and that of FIG. 3 or 5. For this case, beam 700 spends twice as much time on target half B as on target half A, resulting in a film with 2:1 ratio of target half B material to target half A material (or about 67% of the film is from target half B and 33% is from target half A).

Figure 8:
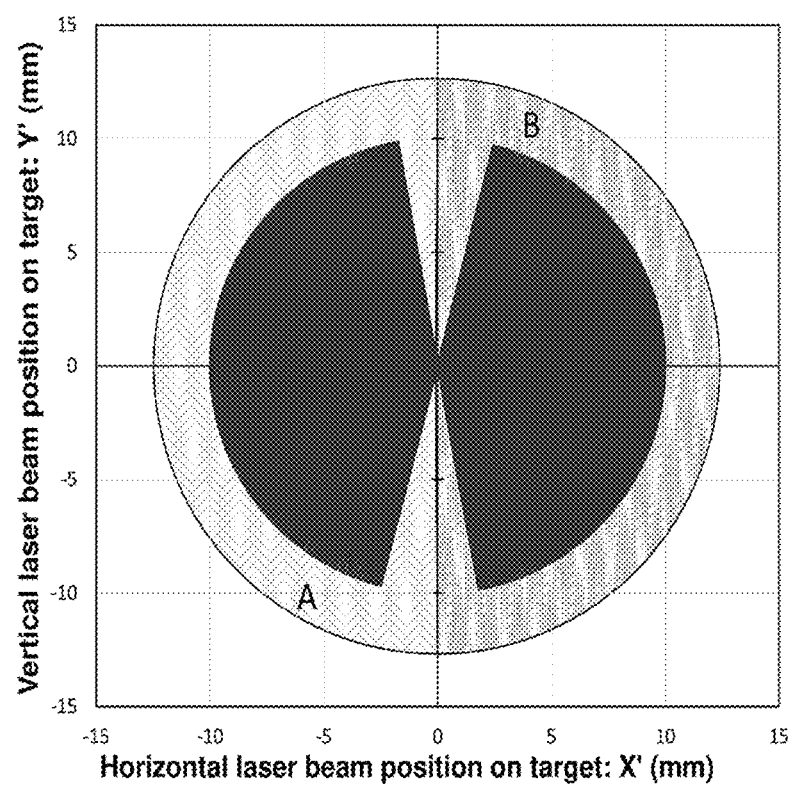
FIG. 8 shows an embodiment of a target with a beam raster pattern of 10 deg, 0.005 rpm, 5200 s, vel[40,40,10,10] having a slow rotation.

FIG. 8 shows a target 800 comprising a first half A and a second half B, demonstrating a slow rotation—beam raster pattern (10 deg, 0.005 rpm, 5200 s, vel [40,40,10,10]). This figure shows the same type of simulated data as for FIG. 2, but after the first 5200 seconds of target rotation, with the target rotating at 0.005 rpm, and raster speeds of 40 and 10 for each raster cycle half, respectively.

Figure 9:
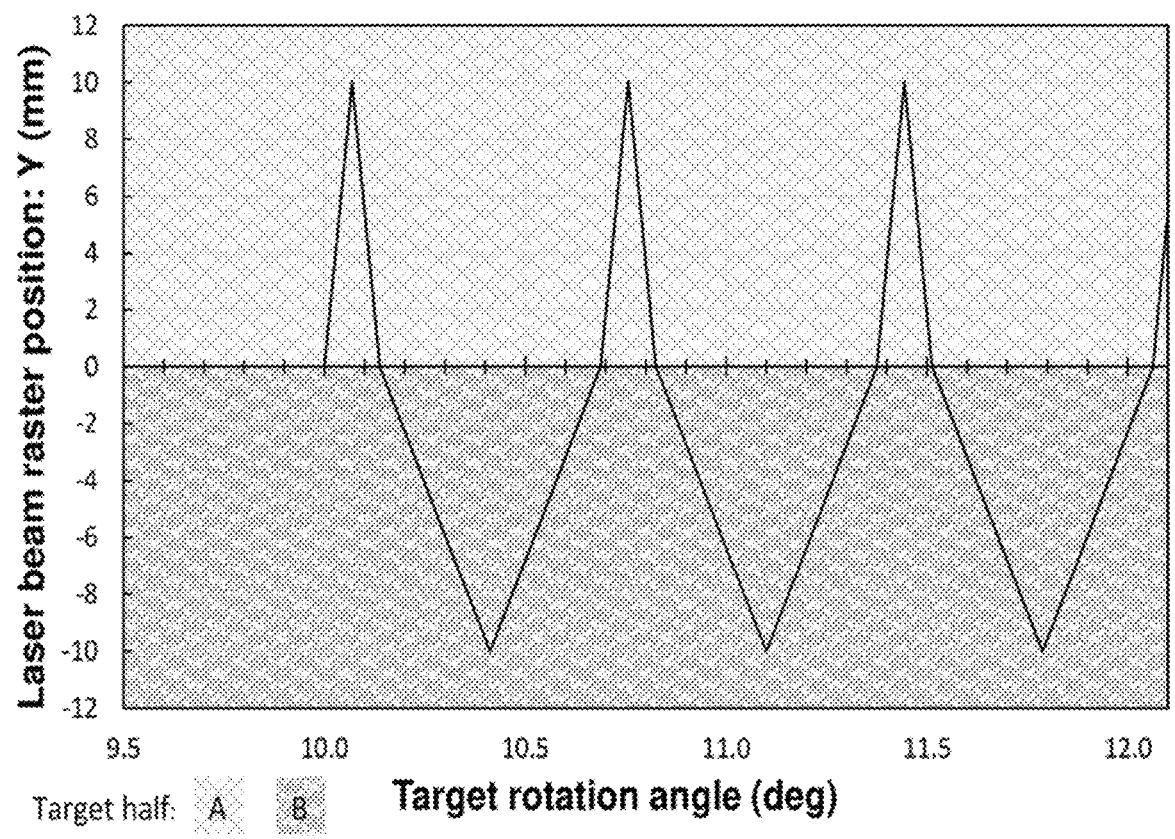
FIG. 9 shows a graph of a beam position vs rotation angle of 10 deg, 0.005 rpm, 5200 s, vel [40,40,10,10] having a slow rotation.

FIG. 9 shows a graph depicting a slow rotation—beam position vs rotation angle (10 deg, 0.005 rpm, 5200 s, vel [40,40,10,10]). FIG. 9 has a beam 900 showing the same type of simulated data as for FIG. 7, but using the simulation parameters of FIG. 8. For this case, beam 900 spends four times as much time on target half B as on target half A, resulting in a film with 4:1 ratio of target half B material to target half A material (or 80% of the film is from target half B and 20% is from target half A).

An alternative method could be to raster the ablation targets themselves in combination with the target rotation, rather than rastering the laser beam.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

We claim:

1. A pulsed laser deposition system comprising:
    a split ablation target having a first section and a second section, wherein the split ablation target contains a film material for film deposition on a substrate, and wherein the film material is comprised of a plurality of component elements, and wherein the first section of the split ablation target contains more of one of the component elements being deposited than the second section, and wherein the split ablation target is rotated about its center;
    a laser beam, wherein the laser beam is rastered back and forth across the split ablation target such that the laser beam spends more time on one of the first and second sections of the split ablation target than another of the first and second sections depending on a selected elemental composition for the film deposition;
    wherein the target rotation and the laser beam rastering are coordinated simultaneously to control the selected elemental composition of the film deposition resulting on the substrate.

2. The pulsed laser deposition system of claim 1, wherein the laser beam is stationary.

3. The pulsed laser deposition system of claim 1, wherein the split ablation target is split into a first half and a second half that are the first and second sections.

4. The pulsed laser deposition system of claim 3 wherein the component elements include bismuth and iron.

5. The pulsed laser deposition system of claim 4 wherein the first half of the split ablation target has a 2:1 atomic ratio of bismuth to iron and the second half of the split ablation target has a 1:1 atomic ratio of bismuth to iron.

6. The pulsed laser deposition system of claim 3, wherein the laser beam is configured to raster for a specific period of time on the first half of the split ablation target, and wherein that specific period of time is longer than a period of time spent on the second half of the split ablation target.

7. The pulsed laser deposition system of claim 3, wherein the laser beam is configured to raster for a specific period of time on the first half of the split ablation target, and wherein that specific period of time is shorter than a period of time spent on the second half of the split ablation target.

8. A method, using the pulsed laser deposition system of claim 1, for depositing the composite film deposition on the substrate, the method comprising the steps of:
    rotating the split ablation target about the center of the split ablation target, the split ablation target comprising the plurality of component elements;
    coordinating simultaneous laser beam rastering across the split ablation target in a specific pattern; and
    varying the selected elemental composition of the resultant film deposition on the substrate.

9. The method of claim 8, wherein the laser beam is stationary and the split ablation target is moved back and forth in the specific pattern.

10. The method of claim 8, wherein the split ablation target is split into a first half and a second half that are the first and second sections.

11. The method of claim 10, wherein the first half of the split ablation target comprises a 2:1 ratio of bismuth to iron and the second half of the split ablation target has a 1:1 ratio of bismuth to iron.

12. The method of claim 8, wherein the split ablation target is rotating at a fast rotation rate and wherein the raster pattern of the laser beam is 10 millimeters, 10 revolutions per minute, and 360 degrees.

13. The method of claim 8, wherein the split ablation target is rotating at a slow rotation rate and the raster pattern of the laser beam is 10 degrees, 0.1 revolutions per minute, and 2200 seconds.

14. The method of claim 10 wherein the laser beam spends twice as much time rastering on the first half of the split ablation target as it does on the second half.

15. The method of claim 10 wherein the laser beam spends four times as much time rastering on the second half of the split ablation target as it does on the first half.

16. The pulsed laser deposition system of claim 1, wherein the plurality of component elements vary in volatility, and the first section contains more than the second section of the one of the component elements that is a more volatile one of the component elements, and
    the more time spent on the one of the sections than the another of the sections compensates for the more volatile element evaporating from the film deposition during its growth to achieve the selected elemental composition for the film deposition.

17. The pulsed laser deposition system of claim 1, the laser beam is rastered back and forth across the split ablation target at two or more speeds.

18. The pulsed laser deposition system of claim 1, wherein the target rotation and the laser beam rastering are coordinated simultaneously such that the laser beam is rastered back and forth across the split ablation target at two or more speeds in millimeters of a raster position of the laser beam per degree of an angle of the target rotation, thereby controlling the selected elemental composition of the film deposition resulting on the substrate.

19. The pulsed laser deposition system of claim 1, wherein the target rotation and the laser beam rastering are coordinated simultaneously such that the laser beam is rastered back and forth across the split ablation target at two or more speeds in millimeters of a raster position of the laser beam per degree of an angle of the target rotation, the two or more speeds including a slow speed and a fast speed that is faster than the slow speed, and the laser beam is rastered back and forth across the split ablation target at the slow speed when the raster position of the laser beam is on the one of the sections of the split ablation target and the laser beam is rastered back and forth across the split ablation target at the fast speed when the raster position of the laser beam is on the another of the sections of the split ablation target, such that the laser beam spends more time on the one of the sections than the another of the sections, thereby controlling the selected elemental composition of the film deposition resulting on the substrate.

20. The pulsed laser deposition system of claim 3, wherein the target rotation and the laser beam rastering are coordinated simultaneously such that the laser beam is rastered back and forth across the split ablation target at two speeds in millimeters of a raster position of the laser beam per degree of an angle of the target rotation, which is at a constant rotation rate around the center of the split ablation target, the two speeds are a slow fixed speed and a fast fixed speed that is faster than the slow fixed speed, the laser beam is rastered back and forth through the center of the split ablation target with an amplitude away from the center in millimeters of the raster position, the amplitude substantially equaling a radius of the split ablation target, and the laser beam is rastered back and forth across the split ablation target at the slow fixed speed with the amplitude whenever the raster position of the laser beam is on the one of the sections of the split ablation target and the laser beam is rastered back and forth across the split ablation target at the fast fixed speed with the same amplitude whenever the raster position of the laser beam is on the another of the sections of the split ablation target, such that the laser beam spends more time on one of the first and second halves of the split ablation target than the other of the first and second halves of the split ablation target, thereby controlling the selected elemental composition of the film deposition resulting on the substrate.

* * * * *